(12) United States Patent
Evans

(10) Patent No.: US 6,672,881 B2
(45) Date of Patent: Jan. 6, 2004

(54) BALL GRID ARRAY SOCKET

(75) Inventor: Robert F. Evans, Bedford, NH (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 09/998,871

(22) Filed: Oct. 31, 2001

(65) Prior Publication Data

US 2003/0082933 A1 May 1, 2003

(51) Int. Cl.[7] .............................. H01R 12/00
(52) U.S. Cl. ........................ 439/71; 439/331
(58) Field of Search ............... 439/71, 66, 591, 439/700, 824, 73, 331

(56) References Cited

U.S. PATENT DOCUMENTS

| | | | | |
|---|---|---|---|---|
| 4,999,023 A | | 3/1991 | Froloff | 439/68 |
| 5,151,040 A | * | 9/1992 | Tanaka | 439/700 |
| 5,380,210 A | * | 1/1995 | Grabbe et al. | 439/66 |
| 5,588,847 A | | 12/1996 | Tate | 439/71 |
| 5,702,255 A | | 12/1997 | Murphy et al. | 439/71 |
| 5,703,753 A | | 12/1997 | Mok | 361/715 |
| 5,761,036 A | | 6/1998 | Hopfer et al. | 361/704 |
| 5,761,044 A | | 6/1998 | Nakajima | 361/719 |
| 5,766,021 A | | 6/1998 | Pickles et al. | 439/70 |
| 5,823,792 A | * | 10/1998 | Regnier | 439/66 |
| 5,973,393 A | | 10/1999 | Chia et al. | 257/690 |
| 6,064,117 A | | 5/2000 | Barrett | 257/738 |
| 6,078,500 A | | 6/2000 | Beaman et al. | 361/704 |
| 6,142,809 A | * | 11/2000 | Fukunaga | 439/331 |
| 6,191,480 B1 | | 2/2001 | Kastberg et al. | 257/727 |
| 6,213,787 B1 | * | 4/2001 | Murphy | 439/331 |
| 6,249,440 B1 | * | 6/2001 | Affolter | 439/71 |
| 6,352,436 B1 | * | 3/2002 | Howard | 439/71 |
| 6,416,332 B1 | * | 7/2002 | Carron et al. | 439/331 |

* cited by examiner

Primary Examiner—Renee Luebke
Assistant Examiner—Felix O. Figueroa
(74) Attorney, Agent, or Firm—Woodcock Washburn LLP

(57) ABSTRACT

A socket is disclosed for connecting an electrical device to an external circuit such as a printed circuit board. The socket comprises a housing having a bottom surface and a top surface with a plurality of apertures therethrough, a plurality of contact terminals, each terminal disposed within one of the apertures of the housing and a compressible structure of electrical conductive material disposed within each of the plurality of contact terminals. Additionally, the socket may also include a loading device for securing the electrical device to the socket.

28 Claims, 3 Drawing Sheets

Place an electrical device above a socket such that the device contacts align with the terminals of a socket
300

↓

Insert the device contacts in the terminals such that the device contacts compress the compressible structure of electrically conductive material disposed in the terminal
310

↓

Secure a loading device to the socket such that the electrical device is also secured to the socket
320

*FIG. 3*

BALL GRID ARRAY SOCKET

FIELD OF THE INVENTION

The present invention relates to electrical connectors. More particularly, the present invention relates to ball grid array sockets.

BACKGROUND OF THE INVENTION

Ball Grid Array (BGA) socket devices are generally known for electrically connecting an electrical array device, such as an IC device, to an external circuit, such as a printed circuit board (PCB). Traditionally, these sockets have connecting pins configured so as to correspond to the connecting terminals of various types of electrical devices. For example, electronic devices or IC packages having leads adapted for use in a ball grid array (BGA) having nearly spherical connecting terminals or for use in a land grid array (LGA) having pad-like connecting terminals are known. These packages have a relatively low height which is desirable because they save space in electronic assemblies.

The BGA type IC package typically consists of a package body incorporating required circuits, and a large number of connecting terminals that are made of a solder material and arranged on a bottom surface of the package body in a grid-like array pattern spherically protruding for connection to an external circuit. For electrically connecting the BGA type IC package to an external circuit, such as a PCB, the package body is typically mounted at a predetermined location on the PCB and the connecting terminals are connected directly to corresponding circuit terminals by partially melting the solder material of the connecting terminals. A drawback, however, of using solder bonding is the package is not easily removable for replacement or upgrade. Consequently, it is desirable to provide an electrical connector for mounting an electronic device on the circuit board in a removable or separable fashion.

Electrical connectors for removably mounting a BGA or LGA package to a PCB are generally known. These removable connectors typically comprise a substantially flat dielectric housing that resides between the electronic device and the PCB. The housing has an array of cavities in which electrical contacts are disposed. The contacts are arranged in correspondence with the array of leads of the electronic device. Each of the contacts typically has a pair of oppositely extending tail portions that project beyond external surfaces of the connector housing. When the electronic device is mounted on the connector, each of the contacts has one tail portion engaged with a respective lead of the electronic device and the opposite tail portion engaged with a respective lead or pad on the PCB.

Typically, the electronic device is removably held on the socket housing by a compressive force which presses down on the electrical contacts of the socket from the top, thereby causing lateral deflection of the contact as the electrical connection is formed between the electronic device and the PCB. Alternatively, traditional sockets have a camming mechanism for selectively moving the electrical contacts of the socket in a lateral direction into or out of engagement with the sides of the leads of the electronic device. This lateral deflection requires space in the socket housing and can dictate minimum spacing between electrical contacts. This problem is compounded as electronic devices become smaller and smaller and as array densities associated with the electronic devices continue to increase Also, conventional socket assemblies do not always provide a reliable mechanical/electrical connection between the electronic device and the socket assembly. One problem is that manufacturing variations in the production of certain components allow for lateral deflection between the components. Such deflection adds stress on the components that can lead to device damage and a loss of proper electrical connection.

Another problem associated with the use of socket assemblies is the difference in how each component reacts to temperature changes. The coefficient of thermal expansion (CTE), as used herein, represents the magnitude of dimensional change of a material over a specific temperature range. By way of example, among an electronic device, a socket, and a PCB, a different CTE will exist as between the connector material, the material of the solder joint, the socket material, and the PCB material. Area array components (connectors/devices/packages, etc.) are typically limited in size based on the effects of the differential CTE among the associated materials. As such, the greater the differential displacements according to the CTE mismatch during thermal changes, the greater concern for the electrical integrity and performance of the system.

Consequently, there is a need for a ball grid array socket that provides for an electrical connection between the socket assembly and the electronic device while also maintaining a reliable mechanical connection in the event of component movement.

BRIEF SUMMARY OF THE INVENTION

The present invention satisfies the aforementioned need by providing systems and methods that provide a solid and reliable connection between a socket assembly and an electronic device secured thereto. In accordance with the present invention, a socket assembly is provided for connecting an electrical device to an electrical circuit, such as, for example, a printed circuit board. The socket assembly comprises a housing having a bottom surface and top surface with a plurality of apertures therethrough, a plurality of contact terminals. Each terminal is disposed within one of the apertures of the socket, and a compressible ball of electrically conductive material disposed within each of the plurality of terminals. As such, when the device is placed in the socket, the contacts of the device depress the compressible ball in the contact terminals and provide an electrical connection and create mechanical play between the terminals and the device contacts. Consequently, if movement occurs between the electrical device and the socket (from thermal expansion or the like), the compressible ball of electrically conductive material will absorb the movement, thereby absorbing any stresses and strains caused by such movement. Additionally, in one embodiment of the present invention, the socket assembly includes a loading device for securing the electrical device to the socket.

BRIEF DESCRIPTION OF THE SEVERAL VIEWS OF THE DRAWING

Other features of the present invention are further apparent from the following detailed description of the embodiments of the present invention taken in conjunction with the accompanying figures, of which:

FIG. 3 illustrates an exemplary method in accordance with the present invention for establishing an electrical connection between an electrical device and a socket.

DETAILED DESCRIPTION OF THE INVENTION

The present invention provides a ball grid array socket that includes a compressible ball of electrically conductive material disposed within a terminal on the housing of the socket. The ball of electrically conductive material serves to provide a solid and reliable fit between a ball contact on an electrical device and the terminal of the socket. In this manner, the compressible ball of electrically conductive material can absorb any physical movement or deflection (e.g. movement caused by thermal expansion or manufacturing deviations) by creating a mechanical buffer between the terminal of the socket and the contacts of the device. The ball of electrically conductive material not only provides a mechanical fit between the terminal and the contact, but also provides a solid electrical connection therebetween.

Figure 1:
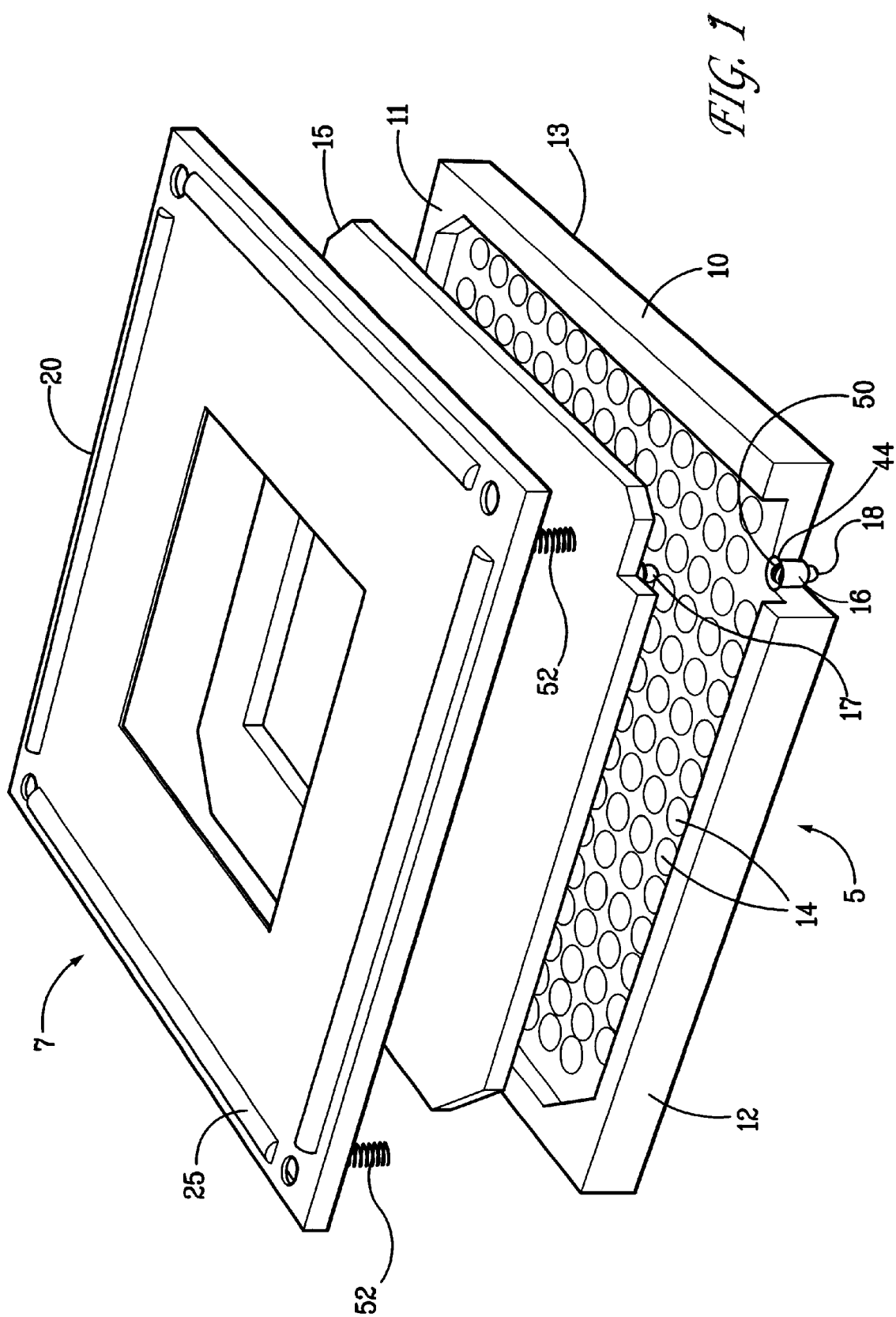
FIG. 1 is a ball grid array socket assembly in accordance with the present invention and electrical component for insertion therein.

FIG. 1 is a ball grid array socket unit 5 that includes socket assembly 7 in accordance with the present invention and an electrical component 15 for insertion therein. The ball grid array socket assembly 7 includes a socket 10 and a loading device 20. The socket 10 includes housing 12 having a bottom surface 13 and top surface 11 with a plurality of apertures 14 therethrough. In one embodiment, the housing 12 is made from a plastic material; however, the housing 12 may be made from any suitable material without departing from the principles of the present invention.

The socket also includes a plurality of terminals 16 disposed within the apertures 14. In one embodiment of the present invention, the terminals 16 are made of copper, however, any suitable material may be used for the terminals 16 without departing from the scope of the present invention. Additionally, each terminal 16 may have a contact 18 disposed on the terminal 16 for electrically connecting the socket 10 to another electrical device, e,g, a printed circuit board (not shown).

In accordance with one embodiment of the present invention, a compressible structure of electrical conductive material 50 is disposed within each of the plurality of terminals 16. As such, when the electrical device 15 having contacts 17 is placed in the socket 10, the contacts 17 of the device 15 depress the compressible structure 50 in the terminals 16 such that an electrical connection is formed between the terminal 16 and the device 15.

Additionally, in another embodiment of the present invention, the socket assembly 7 includes a stainless steel loading device 20 for securing an electrical device 15 to the socket 10. In this manner, the loading device 20 may utilize any conventional fastening structure to secure the device 15 to the socket 10. As shown in FIG. 1, the loading device 20 has apertures 25 therein such that screws, rivets, or the like may be inserted through the loading device 20 to fasten the loading device 20 to the socket 10 thereby securing the device 15 in the socket 10 as well. Other fastening structures such as hinges or clamps may be used to connect the loading device 20 to the socket 10 (and the electrical device 15 to the socket 10) without departing from the scope of the present invention.

In one embodiment of the present invention, the loading device 20 has springs 52 disposed on the surface between the loading device 20 and the socket 10. In this manner, when the loading device 20 is secured to the socket 10, the springs provide a uniform load against the socket 10. Such a configuration prevents uneven load distribution that may result in structural bending and/or physical damage to the socket 10, loading device 20 and/or device 15.

Figure 2:
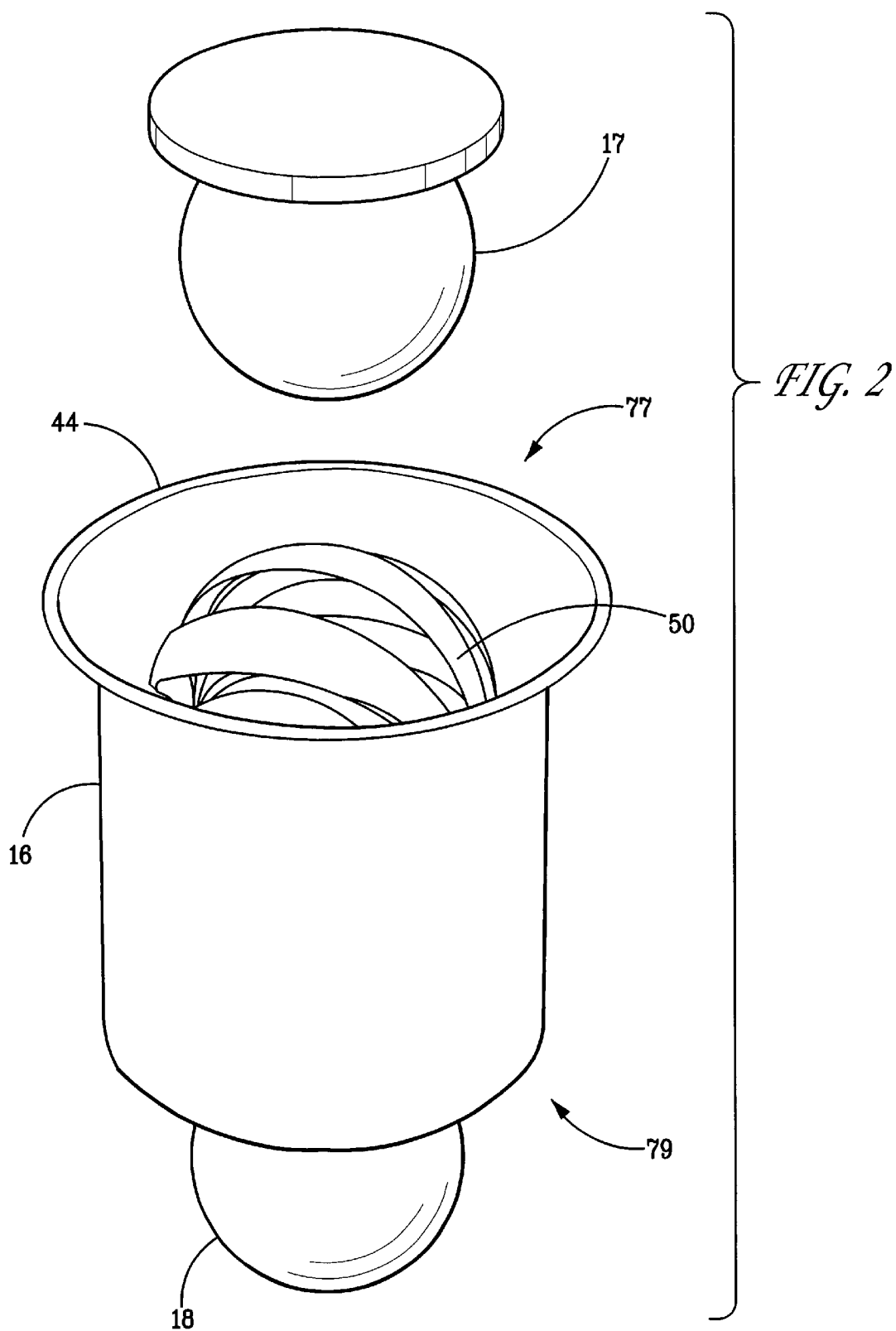
FIG. 2 is a contact terminal in accordance with the present invention.

FIG. 2 is a terminal 16 illustrative of an aspect of the present invention. The terminal 16 may be cup-like having an open end 77 and a closed end 79 with ball contact 18 disposed on the closed end 79 of the terminal 16. The terminal also includes an outwardly extending conical portion 44 at the open end 77. The ball contact 18 is used to electrically connect the socket 10 to an external circuit (not shown). In this manner, as shown in FIG. 2, the structure of electrically conductive material 50 is a ball of metallic wire and is disposed in the terminal 16. As such, when the ball contacts 17 of an electrical device (such as the device 15 of FIG. 1) are inserted into the conical portion 44 of terminal 16, the device contact 17 compresses the ball of electrical material 50 and an electrical connection between the device (not shown) and terminal contact 18 is established. In this manner, the socket 10 with device 15 secured thereto, may be inserted into an external circuit, such as, for example, a printed circuit board and an electrical connection may be established between the device 15 and the circuit.

Additionally, not only does the compressible ball of electrically conductive material 50 establish an electrical connection between the device and the substrate (not shown), but the material 50 also provides mechanical support. As such, the compressible material may compensate for the dimensional tolerance ranges between the device contact 17 and the terminal 16. For example, manufacturing variations may occur in conventional assemblies leaving device contacts with spatial tolerances between the contact and the terminal. Consequently, without the compressible structure of electrically conductive material, the tolerances under certain conditions may result in spatial gaps between the contacts and the terminals that in turn may cause lateral movement of the device contacts while inserted into the terminal. Such movement causes stress to build between the components that may result in loss of electrical connection or physical damage to the contact and/or terminal that could in turn lead to improper electrical communication between the device and an external circuit. With a compressible structure 50 disposed in the terminal 16 in accordance with the present invention, deformation of structure 50 creates an interference fit between contact 17 and terminal 16 and as such, any lateral movement is absorbed by the compressible structure 50 thereby preventing physical damage and loss of an electrical connection.

Additionally, the compressible structure 50 may also absorb any size variations of the components caused by deviations in temperature. For example, the device contact 17 may expand and contract as electrical power is passed therethrough, as such, the compressible structure 50 will absorb the deflection while maintaining a solid reliable electrical connection therebetween.

The compressible structure 50 of electrical material may be of any shape. For example, the structure 50 may be ball-like, as seen in FIG. 2. Alternatively, the structure may be shaped as a compressible coil or spring or the like without departing from the present invention. Further, persons familiar with ball grid array technology in view of the present disclosure will understand that forming structure 50 may have any suitable shape, including a circular cross section, substantially flat strips or any other shape.

FIG. 3 illustrates an exemplary method for establishing an electrical connection between an electrical device having a plurality of device contacts and a socket having a plurality of terminals, the terminals including a compressible structure of electrically conductive material disposed therein. Consequently, once an electrical connection is established between the socket and the device, an electrical connection may be established between an external circuit (such as a printed circuit board) and the socket, thereby electrically connecting the device to the circuit. It is also contemplated that the socket may first be placed on the external circuit and the electrical device inserted into the socket.

In any event, at step 300, the electrical device is placed above a socket such that the device contacts generally align with the terminals of the socket and at step 310, the device contacts are downwardly inserted into the terminals such that the device contacts compress the compressible structure of electrically conductive material disposed in the terminal. In this manner, when the compressible electrically conductive material is compressed, an electrical connection results between the socket and the electrical device. In another embodiment of the present invention, at step 320, a loading device is secured to the socket such that the electrical device is also secured to the socket.

As the foregoing illustrates, the present invention is directed to a ball grid array socket assembly. It is understood that changes may be made to the embodiments described above without departing from the broad inventive concepts thereof. For example, various loading devices and fastening structures may be used without departing from the scope of the present invention. Accordingly, the present invention is not limited to the particular embodiments disclosed, but is intended to cover all modifications that are within the spirit and scope of the invention, as defined by the appended claims.

What is claimed is:

1. A socket assembly for connecting an electrical device having a plurality of contacts to an electrical circuit, the socket comprising:
   a housing having a bottom surface and a top surface with a plurality of apertures therethrough;
   a plurality of terminals, each terminal disposed within one of the apertures of the housing;
   a semi-spherical compressible structure comprising an electrical conductive material disposed within each of the plurality of terminals; and
   a loading device for securing the electrical device to the housing;
   whereby when the electrical device is placed in the housing, the contacts of the electrical device compress the compressible structure in the terminals such that an electrical connection is formed between the terminal and the electrical device.

2. The socket assembly of claim 1 wherein the terminals are made from a copper alloy.

3. The socket assembly of claim 1 wherein the housing is made from a plastic material.

4. The socket assembly of claim 1 wherein the loading device is made of stainless steel.

5. The socket assembly of claim 1 wherein the loading device has spring members attached thereto.

6. The socket assembly of claim 1 wherein the terminals of the socket are adapted to receive ball contacts.

7. The socket assembly of claim 1 wherein the electrical conductive material is a metallic wire.

8. The socket assembly of claim 1 further comprising the contacts disposed on the terminals of the socket.

9. The socket assembly of claim 1 wherein the structure is ball shaped.

10. A socket arrangement for connecting an electronic device having a plurality of contacts to an electronic circuit, the assembly comprising:
    an electronic device having a top surface and a bottom surface, the bottom surface having a plurality of contacts extending therefrom; and
    a socket comprising:
       a housing having a bottom surface and a top surface with a plurality of apertures therethrough;
       a plurality of terminals, each terminal disposed within one of the apertures of the housing; and
       a semi-spherical compressible structure of electrically conductive material disposed within each of the plurality of terminals; and
       wherein when the electronic device is placed in the socket, the contacts of the electronic device abut the semi-spherical compressible structure in the terminals such that an electrical connection is formed between the terminals and the device.

11. The socket arrangement of claim 10 further comprising:
    a loading device for securing the electronic device to the housing.

12. The socket arrangement of claim 10 wherein the terminals are made from a copper alloy.

13. The socket arrangement of claim 10 wherein the housing is made from a plastic material.

14. The socket arrangement of claim 11 wherein the loading device is made of stainless steel.

15. The socket arrangement of claim 11 wherein the loading device has spring members attached thereto.

16. The socket arrangement of claim 10 wherein the contacts of the electronic device are ball contacts.

17. The socket arrangement of claim 10 further comprising the contact disposed on the terminals.

18. The socket arrangement of claim 10 wherein the compressible structure is a ball.

19. A socket for receiving a device having a plurality of contacts for electrically contacting the device to the socket, the socket comprising,
    a housing having a bottom surface and a top surface with a plurality of apertures therethrough;
    a plurality of contact terminals, each terminal disposed within one of the apertures of the housing; and
    a semi-spherical structure comprising an electrically conductive material disposed within each of the plurality of contact terminals, the semi-spherical structure being compressible in response to downward urging thereon;
    whereby when the device is urged in the socket, the contacts of the device depress the compressible semi-spherical structure in the contact terminals such that an electrical connection is formed between the terminal and the device.

20. The socket of claim 19 wherein the terminals are made from a copper alloy.

21. The socket of claim 19 wherein the housing is made from a plastic material.

22. The socket of claim 19 wherein the terminals of the socket are adapted to receive ball contacts.

23. The socket of claim 19 wherein the electrically conductive material is a metallic wire.

24. The socket of claim 19 wherein the structure is a ball.

25. A method for establishing an electrical connection between an electrical device having a plurality of device contacts and a socket having a plurality of terminals, the terminals including a compressible semi-spherical structure of electrically conductive material disposed therein, the method comprising:
    placing the electrical device above the socket such that the device contacts generally align with the terminals of the socket; and
    inserting the device contacts in the terminals such that the device contacts compress the compressible semi-spherical structure of electrically conductive material disposed in the terminal;

wherein compressing the compressible semi-spherical electrically conductive material results in an electrical connection between the socket and the electrical device.

26. The method of claim 25 wherein the method further comprises:

securing a loading device to the socket such that the electrical device is also secured to the socket.

27. The method of claim 25, wherein inserting the device contacts in the terminals comprises downwardly inserting the device contacts in the terminals such that the device contacts compress the compressible structure of electrically conductive material disposed in the terminal.

28. A socket for receiving a device having a plurality of contacts for electrically contacting the device to the socket, the socket comprising, a housing having a bottom surface and a top surface with a plurality of apertures therethrough;

a plurality of contact terminals, each terminal disposed within one of the apertures of the housing and including an outwardly extending conical portion; and a structure comprising an electrically conductive material disposed within each of the plurality of contact terminals, the structure being compressible in response to downward urging thereon;

whereby when the device is urged in the socket, the contacts of the device depress the compressible structure in the contact terminals such that an electrical connection is formed between the terminal and the device wherein the compressible structure is semi-spherical.

* * * * *